United States Patent [19]

Haluska et al.

[11] Patent Number: 4,826,733

[45] Date of Patent: May 2, 1989

[54] SiN-CONTAINING COATINGS FOR ELECTRONIC DEVICES

[75] Inventors: Loren A. Haluska; Keith W. Michael; Sarah S. Snow; Leo Tarhay, All of Midland, Mich.; Ronald H. Baney, Nagoya, Japan

[73] Assignee: Dow Corning Corporation, Midland, Mich.

[21] Appl. No.: 937,276

[22] Filed: Dec. 3, 1986

[51] Int. Cl.$^4$ .................................................. B32B 9/04
[52] U.S. Cl. .................................... 428/447; 427/38; 427/53.1; 427/407.1; 427/387
[58] Field of Search .................. 427/38, 51.1, 407.1, 427/387; 428/447

[56] References Cited

U.S. PATENT DOCUMENTS

| | | |
|---|---|---|
| 4,312,970 | 2/1981 | Gaul . |
| 4,340,619 | 1/1981 | Gaul . |
| 4,395,460 | 9/1981 | Gaul . |
| 4,397,828 | 8/1983 | Seyferth et al. . |
| 4,404,153 | 9/1983 | Gaul . |
| 4,482,669 | 11/1984 | Seyferth et al. . |
| 4,482,689 | 11/1984 | Haluska . |
| 4,535,007 | 8/1985 | Cannady . |
| 4,540,803 | 9/1985 | Cannady . |
| 4,543,344 | 9/1985 | Cannady . |
| 4,696,834 | 9/1987 | Varaprath ........................ 437/223 |
| 4,742,143 | 5/1988 | Haluska ............................. 528/37 |
| 4,745,205 | 5/1988 | Haluska ........................... 556/412 |
| 4,757,035 | 7/1988 | Baney ................................ 501/88 |

OTHER PUBLICATIONS

Gupta & Chin, Characterization of Spin-On Glass Films as a Planarizing Dielectric, 1985, 22, 349–365.
Glaser & Pantano, Effect of the $H_2O$/Teos Ration Upon the Preparation & Nitridation of Silica Sol/Gel Films, 1984, Journal of Non–Crystalline Solids, 63, 209–221.

*Primary Examiner*—Bernard D. Pianalto
*Attorney, Agent, or Firm*—James E. Bittell

[57] ABSTRACT

A method of forming at low temperatures silicon- and nitrogen-containing ceramic or ceramic-like coatings for the protection of electronic devices. The coatings are produced by the ceramification at temperatures of, or below, 400 degrees Centigrade of preceramic silicon nitrogen-containing polymer coatings deposited from a solvent solution. The coatings are useful for planarizing the surfaces of electronic devices and for passivation.

37 Claims, No Drawings

SiN-CONTAINING COATINGS FOR ELECTRONIC DEVICES

BACKGROUND OF THE INVENTION

Electronic devices, to be serviceable under a wide variety of environmental conditions, mus be able to withstand moisture, heat, and abrasion, among other stresses. A significant amount of work has been reported directed toward the preparation of coatings for electronic devices which can increase the reliability of the devices. None of the conventional coatings available today, including ceramic and metal packaging, can perform well enough by itself to protect an electronic device against all environmental stresses.

A common cause of failure of electronic devices is microcracks or voids in the surface passivation of the semiconductor chip allowing the introduction of impurities. Thus a need exists for a method which will overcome the formation of microcracks, voids or pinholes in inorganic coatings of electronic devices.

Passivating coatings on electronic devices can provide barriers against ionic impurities, such as chloride ion (Cl—) and sodium ion (Na+), which can enter an electronic device and disrupt the transmission of electronic signals. The passivating coating can also be applied to electronic devices to provide some protection against moisture and volatile organic chemicals.

Amorphous silicon (hereinafter a-Si) films have been the subject of intense research for various applications in electronic industries, however, the use of a-Si films for environmental or hermetic protection of electronic devices is unknown. A number of possible processes have been previously disclosed for forming a-Si films. For instance, for producing films of amorphous silicon, the following deposition processes have been used: chemical vapor deposition (CVD), plasma enhanced CVD, reactive sputtering, ion plating and photo-CVD, etc. Generally, the plasma enhanced CVD process is industrialized and widely used for depositing a-Si films.

Known to those skilled in the art is the utility of substrate planarization as an interlayer within the body of an electronic device and between the metallization layers. Gupta and Chin (Microelectronics Processing, Chapter 22, "Characteristics of Spin-On Glass Films as a Planarizing Dielectric", pp 349–65, American Chemical Society, 1986) have shown multilevel interconnect systems with isolation of metallization levels by conventional interlevel dielectric insulator layers of doped or undoped $SiO_2$ glass films. However, CVD dielectric films provide only at best a conformal coverage of substrate features which is not conducive to continuous and uniform step coverage by an overlying metallization layer. The poor step coverage results in discontinuous and thin spots in the conductor lines causing degradation of metallization yields as well as device reliability problems. Spin-on glass films have been utilized to provide interlayer isolation between the metallization layers, the top layer of which is later patterned by lithographic techniques. Topcoat planarization on the surface of an electronic device as opposed to planarizing interlevel dielectric layers, however, is unknown.

Under the teachings of the prior art, a single material most often will not suffice to meet the ever increasing demands of specialty coating applications, such as those found in the electronics industry. Several coating properties such as microhardness, moisture resistance, ion barrier, adhesion, ductility, tensile strength, thermal expansion coefficients, etc., need to be provided by successive layers of different coatings.

Silicon and nitrogen-containing preceramic polymers, such as silazanes have been disclosed in various patents, including U.S. Pat. No. 4,404,153, issued Sept. 13, 1983 to Gaul, wherein is disclosed a process for preparing $R'_3SiNH-$ containing silazane polymers by contacting and reacting chlorine-containing disilanes with $(R'_3Si)_2NH$ where R' is vinyl, hydrogen, an alkyl radical of 1 to 3 carbon atoms or the phenyl group. Gaul also teaches therein the use of the preceramic silazane polymers to produce silicon-carbon-nitrogen-containing ceramic materials.

Gaul in U.S. Pat. No. 4,312,970, issued Jan. 26, 1982, obtained ceramic materials by the pyrolysis of preceramic silazane polymers, which polymers were prepared by reacting organochlorosilanes and disilazanes.

Gaul in U.S. Pat. No. 4,340,619, issued July 20, 1982, obtained ceramic materials by the pyrolysis of preceramic silazane polymers, which polymers were prepared by reacting chlorine-containing disilanes and disilazanes.

Cannaday in U.S. Pat. No. 4,540,803, issued Sept. 10, 1985, obtained ceramic materials by the pyrolysis of preceramic silazane polymers, which polymers were prepared by reacting trichlorosilane and disilazanes.

The instant invention relates to the enhancement of the protection of electronic devices by the low temperature formation of thin multilayer ceramic or ceramic-like coatings on the surface of the device. What has been discovered is a method of forming one or more silicon-and nitrogen-containing ceramic or ceramic-like coatings for the protection of electronic devices.

SUMMARY OF THE INVENTION

The instant invention relates to the low temperature formation of single layer and multilayer coatings for the protection of electronic devices. By "low temperature" in the instant invention is meant temperatures of, or below, 400 degrees Centigrade. The single layer coating of the present invention comprises silicon and nitrogen-coating ceramic or ceramic-like coating applied to an electronic device by means of ceramification of a preceramic silicon and nitrogen-containing polymer coating. The instant invention also relates to the formation of multilayer coatings for the protection of electronic devices. The multilayer coatings of the present invention consist of (1) a silicon and nitrogen-containing ceramic or ceramic-like coating as a planarizing and passivating coating on the device, and (2) a top coating of silicon-containing material, silicon nitrogen-containing material, or silicon carbon-containing material providing additional protection for the device.

DETAILED DESCRIPTION OF THE INVENTION

The present invention relates to a method of forming silicon nitrogen-containing coatings on an electronic device, which method comprises coating an electronic device with a ceramic or ceramic-like coating by means of diluting a silicon and nitrogen-containing preceramic polymer in a solvent, coating an electronic device with said preceramic polymer solution, drying the preceramic polymer solution so as to evaporate the solvent and thereby deposit a preceramic polymer coating on the electronic device, and heating the coated device in the absence of air to produce the ceramic or ceramic-like coated electronic device. The drying and heating of the preceramic polymer solution in the instant invention is preferably done in the absence of moisture and air so as to preclude the introduction of oxygen into the coatings. Of particular value as silicon-and nitrogen-containing materials in the instant invention are silazane, disilazane, and polysilazane polymers. In the instant invention, by "ceramic-like" is meant those pyrolyzed silicon-nitrogen containing materials which are not fully free of residual carbon and/or hydrogen but which are otherwise ceramic-like in character. By "electronic device" in the instance invention is meant devices including, but not limited to, electronic devices, silicon based devices, gallium arsenide devices, focal plane arrays, opto-electronic devices, photovoltaic cells and optical devices.

The present invention also relates to a method of forming a silicon-containing coating on an electronic device coated with a ceramic or ceramic-like silicon nitrogen-containing coating, which method comprises coating an electronic device with a ceramic or ceramic-like coating by means of (A) diluting a silicon and nitrogen-containing preceramic polymer in a solvent, coating an electronic device with said preceramic polymer solution, drying the preceramic polymer solution so as to evaporate the solvent and thereby deposit a preceramic coating on the electronic device, heating the coated device in the absence of air to produce the ceramic or ceramic-like coating, and (B) applying to the ceramic or ceramic-like coated device a silicon-containing coatinb by means of decomposing in a reaction chamber a silane, polysilane, halosilane, halodisilane, polyhalosilane or mixtures thereof in the vapor phase, at a temperature between 200 and 400 degrees Centrigrade, in the presence of the ceramic or ceramic-like coated device, whereby a ceramic or ceramic-like coated electronic device containing a silicon-containing coating thereon is obtained. The coatings produced by the instant invention exhibit strong adhesion to electronic devices, are abrasion resistant, and are moisture resistant.

The invention further relates to a method of forming a silicon nitrogen-containing coating on an electronic device coated with a ceramic or ceramic-like silicon nitrogen-containing coating, which method comprises (A) coating an electronic device with a ceramic or ceramic-like coating by means of diluting a silicon and nitrogen-containing preceramic polymer in a solvent, coating an electronic device with said preceramic polymer solution, drying the preceramic polymer solution so as to evaporate the solvent and thereby deposit a preceramic coating on the electronic device, heating the coated device in the absence of air to produce the ceramic or ceramic-like coating thereon, and (B) applying to the ceramic or ceramic-like coated device a silicon nitrogen-containing coating by means of decomposing in a reaction chamber a silane, polysilane, halosilane, halodisilane, polyhalosilane or mixtures thereof, and ammonia, in the vapor phase, at a temperature between 200 and 400 degrees Centrigrade, in the presence of the ceramic or ceramic-like coated device, whereby a ceramic or ceramic-like coated electronic device containing a silicon nitrogen-containing coating thereon is obtained.

The invention further relates to a method of forming silicon carbon-containing coatings on an electronic device coated with a ceramic or ceramic-like silicon nitrogen-containing coating, which method comprises (A) coating an electronic device with a ceramic or ceramic-like coating by means of diluting a silicon and nitrogen-containing preceramic polymer in a solvent, coating an electronic device with said preceramic polymer solution, drying the preceramic polymer solution so as to evaporate the solvent and thereby deposit a preceramic coating on the electronic device, heating the coated device in the absence of air to produce the ceramic or ceramic-like coating thereon, and (B) applying to the ceramic or ceramic-like coated device a silicon carbon-containing coating by means of decomposing in a reaction chamber a silane, polysilane, halosilane, halodisilane, polyhalosilane or mixtures thereof, and a material selected from the group consisting of alkanes of one to six carbon atoms, alkylsilanes, and alkylhalosilanes, in the vapor phase, at a temperature between 200 and 400 degrees Centrigrade, in the presence of the ceramic or ceramic-like coated device, whereby a ceramic or ceramic-like coated electronic device containing a silicon carbon-containing coating thereon is obtained.

The instant invention also relates to the formation of silicon or silicon- and nitrogen-containing topcoats for ceramic and ceramic-like coated electronic devices whereby the topcoat is prepared by known CVD or plasma enhanced CVD techniques. The CVD or plasma enhanced CVD topcoats of the instant invention can be amorphous or crystalline, or mixtures thereof.

The invention further relates to a method of making a scratch resistant and high temperature resistant protective coating on an electronic device. The coatings of the instant invention also possess excellent thermal conductivity which helps to eliminate "hot spots" created from heat generated within the coated electronic devices.

Preceramic silzane polymers suitable for use in this present invention are well known in the art. The preceramic silazane polymers suitable for use in this invention must be capable of being converted to a ceramic or ceramic-like material at elevated temperatures. Mixtures of preceramic silazane polymers and/or other silicon- and nitrogen-containing materials may also be used in this invention. Examples of preceramic silazane polymers or polysilazanes suitable for use in this invention include polysilazanes as described by Gaul in U.S. Pats. Nos. 4,312,970 (issued Jan. 26, 1982), 4,340,619 (issued July 20, 1982), 4,395,460 (issued July 26, 1983), and 4,404,153 (issued Sept. 13, 1983), all of which are hereby incorporated by reference. Suitable polysilazanes also include these described by Haluska in U.S. Pat. No. 4,482,689 (issued Nov. 13, 1984) and by Seyferth et al. in U.S. Pat. No. 4,397,828 (issued Aug. 9, 1983), and Seyferth et al. in U.S. Pat. No. 4,482,669 (issued Nov. 13, 1984) which are hereby incorporated by reference. Other polysilazanes suitable for use in this invention are disclosed by Cannady in U.S. Pats. Nos. 4,540,803 (issued Sept. 10, 1985), 4,535,007 (issued Aug. 13, 1985), and 4,543,344 (issued Sept. 24, 1985), and by Baney et al. in U.S. Pat. No. 4,757,035, issued July 12, 1988, all of which are hereby incorporated by reference. Also suitable for use in this invention are dihydridosilazane polymers prepared by the reaction of $H_2SiX_2$, where X = a halogen atom, and $NH_3$. These $(H_2SiNH)_n$ polymers are well known in the art, but have not been used for the protection of electronic devices. (See, for example, Seyferth, U.S. Pat. No. 4,397,828, issued Aug. 9, 1983) Still other silicon-and nitrogen-containing materials may be suitable for use in the present invention.

In the instant invention, a preceramic polymer containing silicon and nitrogen is diluted to low solids (e.g., 0.1 to 5 weight %) in a solvent such as toluene or n-heptane. Preceramic polymers within the scope of the present invention include, but are not limited to, silazanes, disilazanes, polysilazanes, and other silicon and nitrogen-containing materials.

The preceramic polymer solvent solution is then coated onto an electronic device, such as an RCA 4011 CMOS device, and the solvent allowed to evaporate by drying in the absence of air. The coating method used to apply the preceramic polymer solution can be, but is not limited to, flow coating, spray coating, dip coating, or spin coating. By such means is deposited a preceramic polymer coating which is ceramified by heating the coated device for approximately one hour at 400 degrees Centrigrade under argon. Thin ceramic or ceramic-like SiN-containing planarizing and passivating coatings of less than 2 microns are thus produced on the devices.

A preferred temperature range for ceramifying or partially ceramifying the SiN-containing preceramic polymer is from 200 to 400 degrees Centigrade. A more preferred temperature range for ceramifying the SiN-containing preceramic polymer is from 300 to 400 degrees Centigrade. However, the method of applying the heat for the ceramification or partial ceramification of the SiN-containing coating is not limited to conventional thermal methods. The SiN-containing polymer coatings useful as planarizing and passivating coatings in the instant invention can also be cured by other radiation means, such as, for example, exposure to a laser beam. However, the present invention is not limited to ceramification temperatures below 400° Centrigrade. Ceramification techniques utilizing temperatures up to and including at least 1000° Centigrade will be obvious to those skilled in the art, and are useful in the present invention where the substrate can withstand such temperatures.

By "cure" in the present invention is meant coreaction and ceramification or partial ceramification of the starting material by heating to such an extent that a solid polymeric ceramic or ceramic-like coating material is produced.

The silicon-containing topcoat of the present invention can be obtained at relatively low reaction temperature by the metal-assisted CVD process claimed in the parallel U.S. Pat. No. 4,696,834, issued Sept. 29, 1987 to S. Varaprath, or by conventional non-metal assisted CVD techniques. Other conventional coating techniques known to those skilled in the art can be utilized to provide the topcoat in the instant invention, including but not limited to, for example, Hg sensitized ultraviolet cures and plasma enhanced CVD techniques. The high temperature conditions of the conventional CVD technique normally limit the type of substrate materials which can be coated. Thus, electronic devices which cannot be heated over 400 degrees Centigrade without damage cannot be coated by conventional CVD techniques. The choice of substrates to be coated by the instant invention is limited only by the need for thermal and chemical stability at the lower decomposition temperature in the atmosphere of the decomposition vessel. The process of the present invention provides silicon-containing topcoats of thicknesses which can be varied as desired depending upon the concentration of the silicon-containing halides that are being reduced. The silicon-containing topcoats of the present invention exhibit excellent thermal stability and thermal conductivity.

Coatings produced by the instant invention possess low defect density and are useful on electronic devices as protective coatings, as corrosion resistant and abrasion resistant coatings, as temperature and moisture resistant coatings, and as a diffusion barrier against ionic impurities such as $Na^+$ and $Cl^-$. The SiN-containing ceramic or ceramic-like coatings of the instant invention are also useful as interlevel dielectrics within the body of the electronic device and between the metallization layers, thereby replacing spin-on glass films.

Another unique aspect of the coatings produced by the present invention is their transparency to electromagnetic radiation. Thus a particular advantage of the coatings of the present invention is utilization on focal plane arrays, photovoltaic cells, or opto-electronic devices in which electromagnetic radiation can pass into or emanate from the coated device.

EXAMPLE 1

A preceramic silazane polymer, prepared by the method of Cannady in Example 1 in U.S. Pat. No. 4,540,803, was diluted to 1.0 weight percent in toluene. The preceramic silazane polymer solvent solution was then flow coated onto the electronic device and the solvent was allowed to evaporate by drying in the absence of air. By this means was deposited a preceramic polymer passivating coating which was ceramified by heating the coated device for approximately one hour at 400 degrees Centigrade under argon. Thin silicon-nitrogen-containing ceramic or ceramic-like passivating coatings of less than 2 microns (or approximately 3000 Angstroms) were thus produced on the devices.

EXAMPLE 2

Using the procedure of Example 1, a preceramic silazane polymer containing about 5 percent titanium, prepared by the method of Haluska in Example 13 in U.S. Pat. No. 4,482,689, was flow coated onto the electronic device and the solvent allowed to evaporate by drying. By this means was deposited a preceramic polymer coating which was ceramified by heating the coated device for approximately one hour at temperatures up to 400 degrees Centigrade under argon. Thin silicon nitrogen-containing ceramic or ceramic-like passivating coatings of less than 2 microns (or approximately 3000 Angstroms) were thus produced on the devices.

EXAMPLE 3

Using the procedure of Example 1, a preceramic silazane polymer, prepared by the method of Gaul in Example 1 in U.S. Pat. No. 4,395,460, was coated onto the electronic device and the solvent allowed to evaporate by drying. By this means was deposited a preceramic polymer coating which was ceramified by heating the coated device for approximately one hour at temperatures up to 400 degrees Centigrade under argon. Thin silicon nitrogen-containing ceramic or ceramic-like passivating coatings of less than 2 microns (or approximately 3000 Angstroms) were thus produced on the devices.

EXAMPLE 4

A 1-2% solution in diethyl ether of dihydridosilazane polymer, prepared by the method of Seyferth in Example 1 in U.S. Pat. No. 4,397,828, was flow coated onto a CMOS device. The coated device was heated in nitrogen for one hour at 400° C. The coating and pyrolysis treatment did not adversely affect the device function, as determined by a CMOS circuit tester. The coated device withstood 0.1M NaCl exposure for over four and one half hours before circuit failure. A non-protected CMOS device will fail to function after exposure to a 0.1M NaCl solution for less than one minute.

EXAMPLE 5

The electronic devices coated with the planarizing coatings of Examples 1 through 4 were then overcoated with the barrier coats as follows; Hexafluorodisilane, 500 Torr, was placed in a Pyrex glass reaction container along with an electronic device, previously coated with a ceramified silicon nitrogen-containing material. The hexafluorodisilane was transferred to the glass container in such a manner as to preclude exposure to the atmosphere. The reaction container was then attached to a vacuum line, the contents evacuated, and the container thoroughly heated under vacuum with a gas-oxygen torch. The container was sealed with a natural gas-oxygen torch and heated in an oven for 30 minutes at a temperature of approximately 360 degrees Centigrade. During this time the hexafluorodisilane starting material decomposed and formed a silicon-containing topcoat on the previously coated electronic device. The reaction by-products, mixtures of various halosilanes, and any unreacted starting material were removed by evacuation after the container had been reattached to the vacuum line. The ceramic coated electronic device, onto which the decomposed hexafluorodisilane starting material has deposited a silicon-containing topcoating, was

EXAMPLE 6

Using the procedure described in Example 5, dichlorodisilane was thermally decomposed in the presence of the ceramic or ceramic-like Si-N coated electronic device. An amorphous silicon-containing topcoat was thereby deposited onto the ceramic or ceramic-like coated electronic device.

That which is claimed is:

1. A method of forming silicon nitrogen-containing coatings on an electronic device, which method comprises coating an electronic device with a ceramic or ceramic-like coating by means of diluting a silicon and nitrogen-containing preceramic polymer in a solvent, coating an electronic device with said preceramic polymer solution, drying the preceramic polymer solution so as to evaporate the solvent and thereby deposit a preceramic coating on the electronic device, and heating the coated device to a temperature in the range of 200° to 400° C. in the absence of air to produce the ceramic or ceramic-like coated electronic device.

2. A method as claimed in claim 1 wherein the preceramic silicon nitrogen-containing polymer deposited onto the electronic device is ceramified by heated the preceramic polymer coated device to a temperature in the range of 300 to 400 degrees Centigrade.

3. An article comprising a structure having thereon a coating prepared by the method of claim 2.

4. An electronic device coated by the method of claim 2.

5. A method as claimed in claim 1 wherein the preceramic silicon nitrogen-containing polymer deposited on the electronic device is ceramified by heating by means of a laser beam.

6. An article comprising a structure having thereon a coating prepared by the method of claim 5.

7. An electronic device coated by the method of claim 5.

8. An article comprising a structure having thereon a coating prepared by the method of claim 1.

9. A device comprising a structure having therein a coating prepared by the method of claim 1 as an interlevel dielectric insulator.

10. An electronic device coated by the method of claim 1.

11. A method of forming a silicon-containing coating on an electronic device coated with a ceramic or ceramic-like silicon nitrogen-containing coating, which method comprises:
   (A) coating an electronic device with a ceramic or ceramic-like coating by means of diluting a silicon and nitrogen-containing preceramic polymer in a solvent, coating an electronic device with said preceramic polymer solution, drying the preceramic polymer solution so as to evaporate the solvent and thereby deposit a preceramic coating on the electronic device, heating the coated device in the absence of air to produce the ceramic or ceramic-like coating, and
   (B) applying to the ceramic or ceramic-like coated device a silicon-containing coating by means of decomposing in a reaction chamber a silane, polysilane, halosilane, halodisilane, polyhalosilane or mixtures thereof in the vapor phase, in the presence of the ceramic or ceramic-like coated device, whereby a silicon nitrogen-containing ceramic or ceramic-like coated electronic device with a silicon-containing coating thereon is obtained.

12. A method as claimed in claim 11 wherein the silicon-containing coating is deposited onto the ceramic or ceramic-like coated device at a temperature between 200 and 400 degrees Centigrade.

13. An article comprising a structure having thereon a coating prepared by the method of claim 12.

14. An electronic device coated by the method of claim 12.

15. A method as claimed in claim 11 wherein the silicon-containing coating is deposited onto the ceramic or ceramic-like coated device by plasma enhanced chemical vapor deposition.

16. An article comprising a structure having thereon a coating prepared by the method of claim 15.

17. An electronic device coated by the method of claim 15.

18. An article comprisng a structure having thereon a coating prepared by the method of claim 11.

19. An electronic device coated by the method of claim 11.

20. A method of forming a silicon nitrogen-containing coating on an electronic device coated with a ceramic or ceramic-like silicon nitrogen-containing coating, which method comprises:
   (A) coating an electronic device with a ceramic or ceramic-like coating by means of diluting a silicon and nitrogen-containing preceramic polymer in a solvent, coating an electronic device with said preceramic polymer solution, drying the preceramic polymer solution so as to evaporate the solvent and thereby deposit a preceramic coating on the device, heating the coated device in the absence of air to produce the ceramic or ceramic-like coating thereon, and (B) applying to the ceramic or ceramic-like coated device a silicon nitrogen-containing coating by means of decomposing in a reaction chamber a silane, polysilane, halosilane, halodisilane, polyhalosilane or mixtures thereof, and ammonia, in the vapor phase, at a temperature between 200 and 400 degrees Centrigrade, in the presence of the ceramic or ceramic-like coated device, whereby a silicon nitrogen-containing ceramic or ceramic-like coated electronic device with a silicon nitrogen-containing coating thereon is obtained.

21. A method as claimed in claim 20 wherein the silicon nitrogen-containing coating is deposited onto the ceramic or ceramic-like coated device at a temperature between 200 and 400 degrees Centrigrade.

22. An article comprising a structure having thereon a coating prepared by the method of claim 21.

23. An electronic device coated by the method of claim 21.

24. A method as claimed in claim 20 wherein the silicon nitrogen-containing coating is deposited onto the ceramic or ceramic-like coated device by plasma enhanced chemical vapor deposition.

25. An article comprising a structure having thereon a coating prepared by the method of claim 24.

26. An electronic device coated by the method of claim 24.

27. An article comprising a structure having thereon a coating prepared by the method of claim 20.

28. An electronic device coated by the method of claim 20.

29. A method of forming a silicon carbon-containing coating on an electronic device coated with a ceramic or ceramic-like silicon nitrogen-containing coating, which method comprises:

(A) coating an electronic device with a ceramic or ceramic-like coating by means of diluting a silicon and nitrogen-containing preceramic polymer in a solvent, coating an electronic device with said preceramic polymer solution, drying the preceramic polymer solution so as to evaporate the solvent and thereby deposit a preceramic coating on the electronic device, heating the coated device in the absence of air to produce the ceramic or ceramic-like coating thereon, and (B) applying to the ceramic or ceramic-like coated device a silicon carbon-containing coating by means of decomposiing in a reaction chamber a silane, polysilane, halosilane, halodisilane, polyhalosilane or mixtures thereof, and a material selected from the group consisting of alkanes of one to six carbon atoms, alkylsilanes, and alkylhalosilanes, in the vapor phase, in the presence of the ceramic or ceramic-like coated device, whereby a silicon nitrogen-containing ceramic or ceramic-like coated electronic device with a silicon carbon-containing coating thereon is obtained.

30. A method as claimed in claim 29 wherein the silicon carbon-containing coating is deposited onto the ceramic or ceramic-like coated device at a temperature between 200 and 400 degrees Centrigrade.

31. An article comprising a structure having thereon a coating prepared by the method of claim 30.

32. An electronic device coated by the method of claim 30.

33. A method as claimed in claim 29 wherein the silicon carbon-containing coating is deposited onto the ceramic or ceramic-like coated device by plasma enhanced chemical vapor deposition.

34. An article comprising a structure having thereon a coating prepared by the method of claim 33.

35. An electronic device coated by the method of claim 33.

36. An article comprising a structure having thereon a coating prepared by the method of claim 29.

37. An electronic device coated by the method of claim 29.

* * * * *